(12) United States Patent
Both et al.

(10) Patent No.: US 9,557,194 B2
(45) Date of Patent: Jan. 31, 2017

(54) INPUT DEVICE FOR AN ELECTRICAL DEVICE

(71) Applicant: BSH Bosch und Siemens Hausgeräte GmbH, Munich (DE)

(72) Inventors: Marianne Both, München (DE); Andreas Dachs, Neufraunhofen (DE); Roman Makhtyuk, Alteglofsheim (DE); Bernd Martin, Stein an der Traun (DE); Herbert Mayer, Regensburg (DE); Matthias Sorg, Wonneberg (DE)

(73) Assignee: BSH Hausgeräte GmbH, Munich (DE)

( * ) Notice: Subject to any disclaimer, the term of this patent is extended or adjusted under 35 U.S.C. 154(b) by 60 days.

(21) Appl. No.: 14/431,352

(22) PCT Filed: Sep. 18, 2013

(86) PCT No.: PCT/EP2013/069376
§ 371 (c)(1),
(2) Date: Mar. 26, 2015

(87) PCT Pub. No.: WO2014/048812
PCT Pub. Date: Apr. 3, 2014

(65) Prior Publication Data
US 2015/0300846 A1    Oct. 22, 2015

(30) Foreign Application Priority Data

Sep. 26, 2012   (DE) .................. 10 2012 217 347

(51) Int. Cl.
*G01D 5/34* (2006.01)
*G01D 5/347* (2006.01)
(Continued)

(52) U.S. Cl.
CPC ............ *G01D 5/3473* (2013.01); *F24C 7/082* (2013.01); *H03K 17/968* (2013.01); *G05G 1/08* (2013.01);
(Continued)

(58) Field of Classification Search
CPC .............................. F24C 7/082; G01D 5/3473
(Continued)

(56) References Cited

U.S. PATENT DOCUMENTS 5,223,864 A    6/1993  Twisselmann
5,920,131 A    7/1999  Platt et al.
(Continued)

FOREIGN PATENT DOCUMENTS

DE     2646047 A1    6/1978
DE   10218294 A1   11/2003
(Continued)

OTHER PUBLICATIONS

National Search Report DE 10 2012 217 347.1 dated Sep. 6, 2013.
International Search Report PCT/EP2013/069376 dated Dec. 17, 2013.

*Primary Examiner* — Thanh Luu
(74) *Attorney, Agent, or Firm* — Michael E. Tschupp; Andre Pallapies

(57) ABSTRACT

An input device for an electrical device includes a base which can be attached to the electrical device and has at least one light source for producing a measurement beam, and at least one sensor for detecting the reflected measurement beam. An input actuator is movable in relation to the base and includes a plurality of reflection bodies for deflecting the measurement beam onto the sensor. Each reflection body has an entry area for entry of the measurement beam into the reflection body, at least one reflection surface for reflecting (Continued)

the measurement beam, and an outlet area for outlet of the measurement beam from the reflection body.

27 Claims, 2 Drawing Sheets

(51) Int. Cl.
- *F24C 7/08* (2006.01)
- *H03K 17/968* (2006.01)
- *G05G 1/08* (2006.01)

(52) U.S. Cl.
CPC ........... *H03K 2217/94063* (2013.01); *H03K 2217/96062* (2013.01)

(58) Field of Classification Search
USPC .................................................. 250/231.14
See application file for complete search history.

(56) References Cited

U.S. PATENT DOCUMENTS

| | | | |
|---|---|---|---|
| 7,317,976 | B2 | 1/2008 | Heimberger et al. |
| 2002/0171626 | A1 | 11/2002 | Nojima et al. |
| 2005/0001156 | A1* | 1/2005 | Onishi ............ G01D 5/30 250/231.13 |
| 2005/0189820 | A1 | 9/2005 | Blumenthal et al. |
| 2009/0015360 | A1* | 1/2009 | North ............ G06F 3/0362 335/209 |
| 2010/0004170 | A1 | 1/2010 | Winter et al. |
| 2013/0268098 | A1 | 10/2013 | Goss et al. |

FOREIGN PATENT DOCUMENTS

| | | |
|---|---|---|
| DE | 102004013947 B3 | 12/2005 |
| DE | 102007003012 A1 | 9/2008 |
| EP | 1150242 A2 | 10/2001 |
| JP | H0528879 A | 2/1993 |
| WO | 9423273 A1 | 10/1994 |
| WO | 2010084062 A2 | 1/2010 |

* cited by examiner

INPUT DEVICE FOR AN ELECTRICAL DEVICE

BACKGROUND OF THE INVENTION

The invention relates to an input device for an electrical device.

Input devices are required on electrical devices to specify target conditions of the device. For a cooking appliance the target conditions include the temperature of the cooking compartment, the selection of cooking conditions, such as heat from above, heat from below, use of the fan and the like and for a hob the selection of cooking zones and their temperature.

Traditionally, switches with a rotatable shaft are used for electrical devices, wherein an actuator is fastened at the end of the shaft and the device interprets the rotation of the actuator as an input instruction. Also known is an optical rotary encoder, like in DE 43 11 496 DE, which operates according to the reflection and/or light barrier principle and in which a magnetic detent is obtained. An optical input device is known from DE 10 2006 062 071 B4, which refractively redirects the light emanating from a light source several times and reads out the input of a hand movement on an operating area.

It is the object of the present invention to improve the known embodiments of the input devices. A system which is designed as simply as possible should be provided which can be cleaned easily and which is tolerant to contamination. Furthermore, the user should receive feedback via an input which has been made.

BRIEF SUMMARY OF THE INVENTION

An input device for an electrical device has a base which can be attached to the device and an input actuator which can be moved in relation to the base. The base comprises at least one light source for producing a measurement beam and at least one sensor for detecting the reflected measurement beam, and the input actuator comprises a plurality of reflection bodies for reflecting the measurement beam onto the sensor, each reflection body having an entry area for entry of the measurement beam into the reflection body, at least one reflection surface for reflecting the measurement beam and one outlet area for outlet of the measurement beam from the reflection body. Beam deflection within a prism is understood as a reflection. In particular, this design results in the beam being conducted inside the material for reflection and this means that contamination of the reflection surface has no effect or only a reduced effect on the quality of the reflection.

The entry area and the outlet area are preferably designed such that the measurement beam essentially hits the entry area vertically and the reflection body essentially leaves the outlet area vertically. It was recognized that on entry of the measurement beam, unwanted reflections on the contact surface can be reduced if the beam hits the surface vertically. In the event of contamination as well, the beam path is less disturbed if the beam direction is vertically aligned with the corresponding surface.

In a preferred embodiment the entry area and the outlet area are on the same plane as this results in a larger common, flat surface which can be cleaned in a single combined operation. In addition, the number of corners and edges are reduced in this way and consequently, the possibilities of the accumulation of contamination.

In particular, the reflection bodies for detecting a rotating movement of the input actuator are arranged in a circular pattern as this creates a trajectory without a beginning or an end, which is advantageous, for example, for an incremental encoder.

Advantageously, the reflection bodies are integrally connected in a bracket, and/or a common reflection ring. This may be an inexpensive injection-molded part which ensures that the reflection bodies are always exactly and correctly positioned relative to one another.

Further, the base has at least one magnet and the input actuator has a plurality of metallic sections. A trajectory of the metallic sections relative to the magnet is defined for input with the input device and detent-like haptic feedback is provided. Further, the base has a viewing surface facing in the direction of the exterior of the device when the input device is attached and offset clearance opposite the viewing surface in the direction of the interior of the device for the input actuator. The metallic sections are completely incorporated into the clearance and in particular, the reflection bodies are incorporated into the clearance by at least 60% and in particular, completely. The input actuator is thus integrated into the front of the device as far as possible and this results in a pleasant overall design.

The base preferably has a viewing surface facing in the direction of the exterior of the device when the input device is attached, wherein the input actuator in its entirety is not further than 10 mm from the viewing surface in the direction of the exterior of the device. As a result, the overall impression is also improved and the risk of getting caught on projecting parts is significantly reduced.

Preferably at least one part of a reflection body is arranged in a space between two adjacent metallic sections and in particular at least one part of one of the reflection surfaces of the reflection body is arranged there. As the number of reflection surfaces is identical to that of the metallic sections, the space can be put to better use in this way and the input actuator has a low installation height as a result.

Further, the input actuator is held on the base with magnetic forces such that it can only be removed from the base by overcoming the magnetic retaining forces and without releasing a further anchoring element, whereby cleaning of both the input actuator and its mounting is made easier.

BRIEF DESCRIPTION OF THE DRAWINGS

The invention is explained in exemplary fashion hereinafter with reference to the diagrams on the basis of preferred embodiments. The diagrams show.

DETAILED DESCRIPTION OF EXEMPLARY EMBODIMENTS OF THE PRESENT INVENTION

Figure 1:
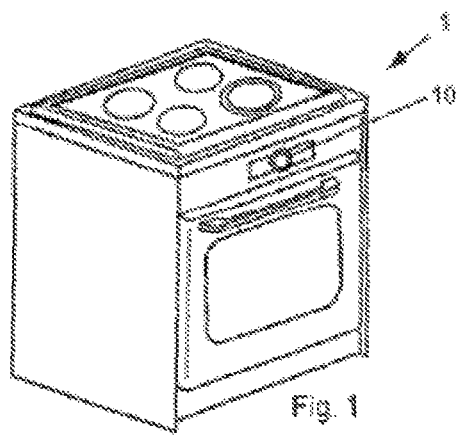
FIG. 1 a perspective view of a cooking appliance with an input device.
Figure 2:
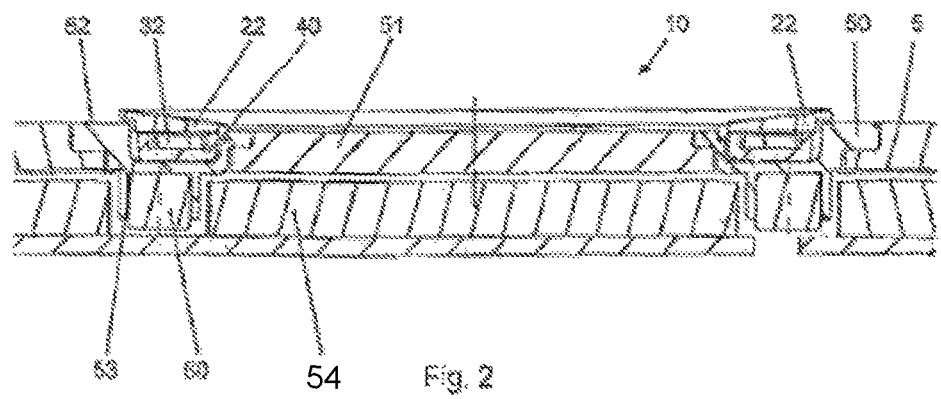
FIG. 2 a cross section through the input device.

FIG. 1 in general shows an electrical device 1 and in particular an oven. An input device 10 is attached to the forward-facing vertical surface. FIG. 2 shows a horizontal section through the front of the cooking appliance. The device has a front panel 5 into which the input device 10 is inserted. The input device 10 has a base 50 which is stationary and permanently connected, for example, screwed or clipped, to the front panel. The base 50 has a circular clearance 53 with a U-shaped cross section. The U-shaped cross section has a base area which is parallel to the exterior of the front panel 5 and bounded on both sides by approximately vertical sides, curves being provided in the transition. The majority of the input actuator 20 is incorporated into this clearance 53.

Figure 3:
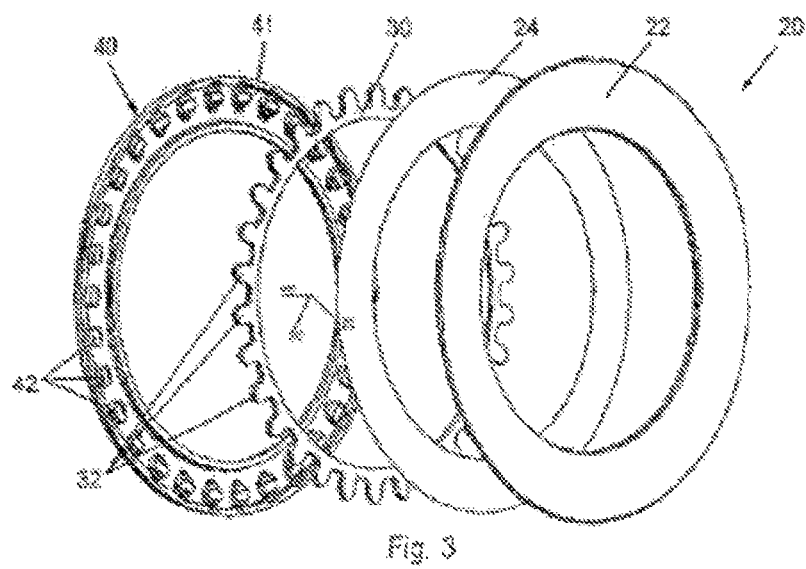
FIG. 3 an exploded view of the input actuator of the input device.

As shown in FIG. 3, the input actuator comprises four components, namely a reflection ring 40, a detent ring 30 of a ferromagnetic material and a bonding 24 with a screen 22. The detent ring 30 is lacquered matt black or anodized to avoid unintentional reflections of the light beam.

Figure 4:
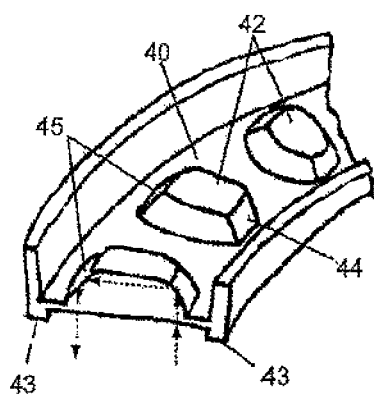
FIG. 4 a perspective view of the reflection ring.

The reflection ring 40 is an injection-molded part made of a transparent, clear plastic, such as, for example, PMMA (polymethyl methacrylate), PC (polycarbonate), PS (polystyrene), COC (cycloolefin copolymers), COP (cycloolefin polymers) or SAN (styrene-acrylonitrile copolymers). As can be seen in FIGS. 3 and 4, the reflection ring 40 has a circular, flat base 41 which on one side has two short elevations encircling the ring and rising from the side which serve as contact surfaces 43 for support and as a sliding surface along the clearance 53. On its other side, the base 41 has an internal and an external circular wall which ensure that the reflection body has a U-shaped contour in a sectional view.

This U-shaped contour serves as a mounting for the detent ring 30. This detent ring comprises a circular web from which a plurality of evenly distributed metallic sections 32 extends radially outwards. The detent ring is a flat punched part with a uniform thickness of approx. 1 mm and made of a ferromagnetic ferrous alloy. The metallic sections are approx. 2 mm in width so that the intervals between the sections 32 are somewhat wider than the sections 32 themselves. When the detent ring 30 is placed in the U-shaped contour of the reflection ring 40, the reflection bodies 42 molded to the reflection ring 40 are located at the aforementioned intervals. These have a radially aligned trapezoidal contour, wherein their sloping sides are at an angle of 45° to the base 41. The screen is a rotated or deep-drawn ring made of stainless steel, such as for example the material 1.4305. Alternatively, it can be made of a high-quality or metal-coated plastic. The bonding 24 shown between the screen 22 and the reflection ring 40 can be designed as a double-sided adhesive foil or symbolizes the introduction of a liquid adhesive in this area. An insoluble connection of the upper and lower part of the ring by welding the plastic ring with a rough surface of the stainless steel is also possible.

The base 50 serves as a bracket for two magnets 60 which are arranged on the inside of the device from the clearance 53 to make active magnetic contact with both the metallic sections 32 and the rotating web of the detent ring 30. The magnets have an operating temperature of at least 120° C. When the input actuator is rotated, the revolving 30 sections 32 are attracted by the magnets one after another, giving the user the haptic impression of a detent, and whereby he receives feedback that an input has been made. Furthermore, in conjunction with the rotating web the metallic sections ensure that the input actuator remains in the clearance 53. As the sides of the U-shaped clearance 53 are vertical to the front of the device, the magnets do not have to be able to hold all the gravitational forces of the input actuator 20 but the input actuator can be supported on the sides. Rather, the magnets must only ensure that the input actuator is held at the base of the clearance 53. When 2 magnets are used, an extraction force of 1 N is produced, wherein this force can be increased by stronger magnets or an increase in the number of magnets.

Figure 5:
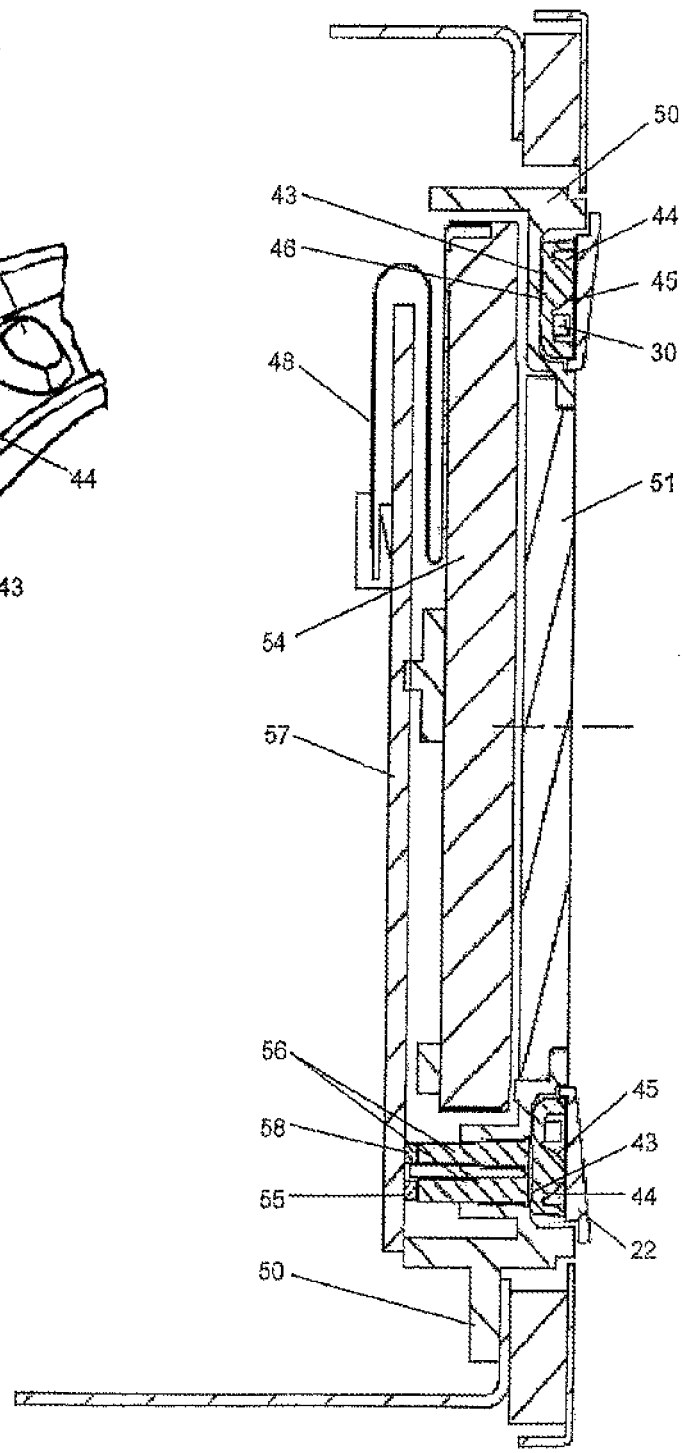
FIG. 5 a second cross section through the input device.

As shown in FIG. 5, the base 50 serves as a bracket for two circuit boards, namely the motherboard 57 and the display board 54 connected to it via a flat ribbon cable 48. The display board is indicated by a relatively broad surface in the diagram and contains a normal circuit board as a bracket and display elements affixed to it, such as, for example, an LED or LCD display. The motherboard serves as a bracket for the light source 55 and the sensor 58. The light source 55 is an LED which emits light at an aperture angle of 60° against its optical axis. Both visible light and infrared light can be used in principle. A light guide 56 is arranged immediately opposite the light source 55 which is an injection-molded part and has a slightly conical shape. The conical shape is due to the molding angles in the plastic injection molding tool and less to focusing the beam. The light guides are used as a transmitter for guiding light from the IR-LED to the reflection ring 40. In the reflection ring the principle of beam deflection in a prism is used for reflecting and preferably no mirrored surfaces are used for this, wherein mirrored surfaces could also be used. The optical function is therefore understood as a prism deflection which deflects the transmitted light back to the phototransistor as the recipient. The diameters of the light guides are selected so that they capture almost 100% of the emitted light and guide it for prism deflection. Theoretically, the length of the light guide can be chosen at will as no light losses occur in the light guide itself as a result of total reflection. Light losses occur at the optical interfaces i.e. the light inlet surfaces in the light guide and prism ring as a result of partial reflection and on the deflection surfaces of the prism as a result of light losses.

Ideally the light guide centers are each arranged precisely in the ellipse focus of the ellipsoidal prism, in other words the curved deflection surface, which in practice is not possible due to the tolerances which occur. As an ellipse has two focal points, the transmission light guide is assigned to one focal point and the other light guide as the recipient light guide is assigned to the second focal point opposite the first. The focal points are interchangeable at will, so that the recipient focal point could also be the transmitter and vice versa. In order to compensate for manufacturing and installation tolerances, the prism is designed such that it can compensate for tolerances of up to approx. +/−0.6 mm. The deflection surfaces are therefore designed as surfaces with multiple curves on the prism which reliably deflect the light via the tolerance zone. With a theoretically precise positioning of the center of the light guide in relation to the coupling-in and/or decoupling point, a flat 45° deflection surface would be sufficient. Nor would the prism then need to be designed as an ellipse but a straight i.e. when viewed from the side rectangular light guide would suffice. The light guide terminates flush with the base of the clearance 53 and in its extension is the (prism ring) reflection ring and depending on its alignment according to the angle, a (prism 42) reflection body 42. The magnets are aligned in relation to the metallic sections 32 such that they align the (prism) reflection body with the light source 55 and the sensor 56 due to the magnetic force.

The light of the light source 55 is guided by the light guide 56 to the base of the clearance and from there via a small air gap into a reflection body. Inside the reflection body it is guided to the first (90° deflection surface) reflection surface 44, there inside the material deflected in the form of light deflection through total reflection such that it hits the second (90° deflection surface) reflection surface 45. There the light is likewise deflected inside the material so that it leaves the reflection ring 40 through the outlet area 46 and is guided to the sensor 58 via a second light guide 56. The entrance and exit angles for the light beam at which it both enters and exits the light guide 56 as well as the respective (prism) reflection body 42, and/or the prism ring or reflection ring 40 are preferably at a right angle to the optical axis to prevent or minimize a (partial) beam reflection as far as possible.

Apart from the aforementioned light source 55, the light guide 56 and the sensor 58, in addition, a corresponding second pair of these elements are provided on the motherboard 57 and offset at an angle n*h+1/3 h opposite the first pair, wherein n is a natural number and h the interval or angular offset of two adjacent reflection bodies 42. Here any other uneven distribution is also possible. The only condition is that the deflection may not coincide for both sensor pairs at the same time in order to ensure an evaluation of the direction of rotation. This also applies to the possible crosstalk of one sensor with another. To rule this out, the sensor pairs must be arranged as far from each other as possible or in opposing directions to each other. Different timing ((multiplex control)) of the sensors is also possible here). When the input actuator is rotated, the sensors 58 will each detect the light beam with a time delay. The rotational speed of the input actuator can be detected from the speed of detection and the direction of rotation from the time offset of the detection signals of the two sensors. Thus, for example, a cooking appliance can be given an instruction to increase the temperature. A display which is integrated into the display board 54 is visible through the glazing 51 and thus the user receives feedback about his inputs by means of an increase or reduction in a displayed setpoint temperature. In addition, he feels the detent-like resistance of the magnets.

As the light guides 56 are inserted into the clearance 53 flush and gap-free and are bonded in place if necessary and as no opening is necessary in the clearance 53 for the magnet detents, the clearance forms a recess free of any indentations which can easily be cleaned in the event of contamination. The inlet and outlet area of the light beam in and out of the reflection ring 40 are also on the same plane which can easily be cleaned. If contamination should nevertheless occur in the area of the optical path of the light beam, with the aforementioned vertical alignment this is significantly less harmful than would have been the case with a reflection at an oblique angle. As the input actuator is only held on the base 50 by magnetic forces, it can easily be removed by the user for cleaning.

With the aforementioned embodiment, the majority of the input actuator is offset from the viewing surface 52 in the direction of the device interior. In practice, only part of the screen protrudes as an input option opposite the viewing surface 52. This produces an appealing design.

As reflection takes place inside the body of the reflection body 42 and in addition the external surfaces of the reflection sides 44 and 45 are inside the enclosed space formed by the reflection ring 40 being bonded to the input actuator 20, no contamination can accumulate on the external surfaces of the reflection surfaces 44 and 45 and thus reflection on these surfaces is always made possible regardless of contamination. A good reflection and low loss of light intensity is necessary for the interface transitions in order to obtain a sufficient amount of light on the sensor and thus be able to reliably detect the movement of the input actuator 20.

In addition, input buttons (not shown) are provided for the input device, with which inputs undertaken using the input actuator 20 can be confirmed, or with which special menu items of a user guide shown via the display can be selected.

The external diameter of the input actuator is 60 mm+/−10 mm and is 15 mm+/−5 mm in width, so that the user can conveniently rotate the input actuator with one finger via contact with the external surface of the screen 22. The screen has a surrounding edge which is larger than the external diameter of the clearance 53, so that the user does not see the gap between the clearance and the reflection ring 40 and to prevent the penetration of contamination into this gap.

Thus far a preferred embodiment with two light source-sensor-pairings was described, with which rotations and directions of rotation can be detected in the form of an incremental encoder. When the number of light source-sensor-pairings is significantly increased, for example to 8 or 10, and according to a predefined logic reflection bodies 42 are partially dispensed with on the reflection ring, an absolute encoder is produced with which the exact and/or absolute angular position of the input actuator is detected. A ring-shaped input actuator was described above. The principles of the invention described can be applied accordingly to a straight-line input actuator which is guided along a linear path.

The invention claimed is:

1. An input device for an electrical device, said input device comprising:
    a base configured for attachment to the electrical device, said base including at least one light source for producing a measurement beam and at least one sensor for detecting the measurement beam, wherein the base includes a viewing surface, which faces in a direction of an exterior of the electrical device when the input device is attached, and a clearance in offset relationship to the viewing surface in a direction of an interior of the electrical device for the input actuator; and
    an input actuator at least partially disposed in the clearance of the base and movable in relation to the base and including a plurality of reflection bodies for deflecting the measurement beam onto the sensor, each said reflection body having an entry area for entry of the measurement beam into the reflection body, at least one reflection surface for reflecting the measurement beam, and an outlet area for outlet of the measurement beam from the reflection body.

2. The input device of claim 1, wherein the entry area and the outlet area are aligned such that the measurement beam hits the entry area essentially vertically and leaves the reflection body essentially vertically to the outlet area.

3. The input device of claim 1, wherein the entry area and the outlet area are on a same plane.

4. The input device of claim 1, wherein the reflection bodies are arranged in a circular pattern for detecting a rotating movement of the input actuator.

5. The input device of claim 1, wherein the input actuator includes a bracket having integrated therein the plurality of reflection bodies formed in one piece with the bracket.

6. The input device of claim 1, wherein the input actuator is spaced in its entirety from the viewing surface in the direction of the exterior of the electrical device by not more than 10 mm.

7. The input device of claim 1, wherein the reflection bodies are incorporated into the clearance by at least 60%.

8. The input device of claim 1, wherein the reflection bodies are completely incorporated into the clearance.

9. The input device of claim 1, wherein the base includes a first light guide that guides the measurement beam from the at least one light source to a reflection body of the plurality of reflection bodies that is positioned above the light guide during movement of the input actuator in relation to the base, and wherein the base includes a second light guide that guides the measurement beam from the reflection body of the plurality of reflection bodies to the at least one sensor.

10. The input device of claim 1, wherein the clearance is a circular clearance, wherein the input actuator includes a circular reflection ring including the plurality of reflection bodies, and wherein the circular reflection ring is concentrically arranged within the circular clearance and rotatable within the circular clearance.

11. The input device of claim 10, wherein the clearance includes a support surface facing the circular reflection ring, wherein the circular reflection ring includes a contact surface facing the support surface of the circular clearance, and wherein the contact surface supports the circular reflection ring on the support surface of the circular clearance and the contact surface slides along the support surface when the input actuator is rotated within the circular clearance of the base.

12. The input device of claim 11, wherein the contact surface includes an elevation extending from a flat surface of the circular reflection ring facing the support surface of the circular clearance, and wherein the elevation contacts and slides along the support surface when the input actuator is rotated within the circular clearance of the base.

13. The input device of claim 11, wherein the base includes a first light guide that guides the measurement beam from the at least one light source to a reflection body of the plurality of reflection bodies that is positioned above the light guide during movement of the input actuator in relation to the base, wherein the base includes a second light guide that guides the measurement beam from the reflection body of the plurality of reflection bodies to the at least one sensor, and wherein an end of each of the first light guide and the second light guide facing the plurality of reflection bodies is disposed at an opening in the support surface of the circular clearance.

14. The input device of claim 10, wherein the reflection bodies are incorporated into the clearance by at least 60%.

15. The input device of claim 10, wherein the reflection bodies are completely incorporated into the clearance.

16. The input device of claim 10, further comprising:

a circular screen on the side of the viewing surface of the base that faces in the direction of the exterior of the electrical device when the input device is attached, wherein a diameter of a surrounding edge of the circular screen is greater than an outer diameter of the circular clearance.

17. The input device of claim 10, further comprising:

a display board visible from the exterior through an opening in the base arranged within an inner diameter of the circular clearance.

18. The input device of claim 1, wherein each of the plurality of reflection bodies includes a first internal reflection surface and a second internal reflection surface, the first internal reflection surface deflecting the measurement beam from the at least one light source to the second internal reflection surface, and the second internal reflection surface deflecting the measurement beam from the second internal reflection surface to at least one sensor.

19. The input device of claim 1, wherein each of the first internal reflection surface and the second internal reflection surface is a flat 45° deflection surface.

20. The input device of claim 19, wherein the base includes a first light guide that guides the measurement beam from the at least one light source to a reflection body of the plurality of reflection bodies that is positioned above the light guide during movement of the input actuator in relation to the base, wherein the base includes a second light guide that guides the measurement beam from the reflection body of the plurality of reflection bodies to the at least one sensor, and wherein a center of the first light guide is arranged in a focus of the first internal reflection surface and a center of the second light guide is arranged in a focus of the second internal reflection surface.

21. An input device for an electrical device, said input device comprising:

a base configured for attachment to the electrical device, said base including at least one light source for producing a measurement beam and at least one sensor for detecting the measurement beam; and an input actuator movable in relation to the base and including a plurality of reflection bodies for deflecting the measurement beam onto the sensor, each said reflection body having an entry area for entry of the measurement beam into the reflection body, at least one reflection surface for reflecting the measurement beam, and an outlet area for outlet of the measurement beam from the reflection body, wherein the base has at least one magnet, said input actuator comprising a plurality of metallic sections, said metallic sections movable along a trajectory relative to the magnet for producing a detent-like haptic feedback for an input with the input device.

22. The input device of claim 21, wherein the base has a viewing surface, which faces in a direction of an exterior of the electrical device when the input device is attached, and a clearance in offset relationship to the viewing surface in a direction of an interior of the electrical device for the input actuator, wherein the metallic sections are completely incorporated into the clearance.

23. The input device of claim 22, wherein the reflection bodies are incorporated into the clearance by at least 60%.

24. The input device of claim 22, wherein the reflection bodies are completely incorporated into the clearance.

25. The input device of claim 21, wherein two adjacent metallic sections define a space in which at least one part of the reflection body is arranged.

26. The input device of claim 25, wherein at least one part of one of the reflection surfaces of the reflection body is arranged in the space between the adjacent metallic sections.

27. An input device for an electrical device, said input device comprising:

a base configured for attachment to the electrical device, said base including at least one light source for producing a measurement beam and at least one sensor for detecting the measurement beam; and an input actuator movable in relation to the base and including a plurality of reflection bodies for deflecting the measurement beam onto the sensor, each said reflection body having an entry area for entry of the measurement beam into the reflection body, at least one reflection surface for reflecting the measurement beam, and an outlet area for outlet of the measurement beam from the reflection body, wherein the input actuator is held on the base with magnetic forces such that the input actuator is only removable from the base by overcoming magnetic retaining forces and without releasing a further anchoring element.

\* \* \* \* \*